US012787725B2

(12) United States Patent
Dorfner

(10) Patent No.: US 12,787,725 B2
(45) Date of Patent: Nov. 3, 2026

(54) SELECTIVE DEPOSITION ON AN EXISTING PATTERNED MASK

(71) Applicant: Tokyo Electron Limited, Tokyo (JP)

(72) Inventor: Alec Dorfner, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 231 days.

(21) Appl. No.: 18/762,359

(22) Filed: Jul. 2, 2024

(65) Prior Publication Data

US 2026/0011555 A1 Jan. 8, 2026

(51) Int. Cl.

| | |
|---|---|
| ***H10P 76/40*** | (2026.01) |
| ***C23C 16/04*** | (2006.01) |
| ***C23C 16/14*** | (2006.01) |
| ***C23C 16/44*** | (2006.01) |
| ***C23C 16/458*** | (2006.01) |
| ***C23C 16/509*** | (2006.01) |
| ***C23C 16/52*** | (2006.01) |
| ***H01J 37/32*** | (2006.01) |
| ***H10P 50/00*** | (2026.01) |
| ***H10P 50/28*** | (2026.01) |
| ***H10P 72/00*** | (2026.01) |

(52) U.S. Cl.

CPC ........ *H10P 76/4085* (2026.01); *C23C 16/042* (2013.01); *C23C 16/14* (2013.01); *C23C 16/4408* (2013.01); *C23C 16/4586* (2013.01); *C23C 16/509* (2013.01); *C23C 16/52* (2013.01); *H01J 37/32715* (2013.01); *H10P 50/283* (2026.01); *H10P 50/73* (2026.01); *H10P 72/0421* (2026.01); *H01J 37/32082* (2013.01); *H01J 2237/2007* (2013.01); *H01J 2237/3321* (2013.01); *H01J 2237/3341* (2013.01)

(58) Field of Classification Search

None

See application file for complete search history.

(56) References Cited

U.S. PATENT DOCUMENTS

| | | | |
|---|---|---|---|
| 10,847,377 B2 | 11/2020 | Dole et al. | |
| 2005/0208434 A1 | 9/2005 | Mosden et al. | |
| 2015/0125606 A1 | 5/2015 | Watanabe et al. | |
| 2017/0179036 A1* | 6/2017 | Chen | H10D 64/0113 |
| 2018/0323068 A1* | 11/2018 | Mallick | H10P 76/405 |
| 2020/0058470 A1 | 2/2020 | Ventzek et al. | |

(Continued)

OTHER PUBLICATIONS

International Search Report and Written Opinion, PCT Application No. PCT/US2025/022805, mailed Jul. 28, 2025, 11 Pages.

(Continued)

*Primary Examiner* — Roberts P Culbert

(74) *Attorney, Agent, or Firm* — Slater Matsil, LLP

(57) ABSTRACT

A method for processing a substrate includes receiving the substrate on a substrate holder disposed in a processing chamber, the substrate including a layer to be processed and a patterned mask disposed over the layer to be processed. The method further includes flowing a processing gas into the processing chamber, and replacing a material of the patterned mask with a metal of the processing gas to form a metal patterned mask occupying a same location as the patterned mask. And the method further includes etching, using the metal patterned mask as an etch mask, the layer to be processed to form a patterned layer, the patterned layer including feature openings.

20 Claims, 6 Drawing Sheets

(56) References Cited

U.S. PATENT DOCUMENTS

| | | | |
|---|---|---|---|
| 2022/0139719 A1 | 5/2022 | Chino et al. |
| 2023/0397416 A1 | 12/2023 | Dorfner et al. |
| 2024/0071772 A1 | 2/2024 | Ishikawa et al. |

OTHER PUBLICATIONS

Groenen, P.A.C., "Chapter 3: WF6 and Si," The Reaction Mechanism of W-CVD on Si, Jan. 1, 1993, 29 pages.

Wikipedia, "Tungsten hexafluoride," downloaded Aug. 2, 2024, https://en.wikipedia.org/wiki/Tungsten_hexafluoride, 7 pages.

* cited by examiner

SELECTIVE DEPOSITION ON AN EXISTING PATTERNED MASK

TECHNICAL FIELD

The present invention relates generally to semiconductor fabrication, and, in particular embodiments, to a system and method for selective deposition on an existing patterned mask.

BACKGROUND

In the field of semiconductor manufacturing, various processes are used to create integrated circuits (ICs) on semiconductor wafers. A typical step in this process is the deposition of materials onto specific regions of the wafer. This can include the deposition of conductive, semiconductive, or dielectric materials to form the intricate structures and interconnects desired for IC functionality.

Traditionally, material deposition includes physical vapor deposition (PVD), chemical vapor deposition (CVD), atomic layer deposition (ALD), and other epitaxial growth techniques. In many instances, it is desired to perform selective deposition on predetermined areas, typically defined by a masking material which resists deposition so as to maintain precision in pattern geometry.

Conventional processes often involve complicated lithography and etch steps to define the mask pattern which can accommodate selective deposition. This can lead to increased complexity and cost. Furthermore, many of these processes are not self-limiting, leading to over-deposition, which may then be removed in subsequent planarization steps such as chemical-mechanical polishing (CMP). These additional steps not only complicate the process flow but also impact the overall throughput and yield.

SUMMARY

In accordance with an embodiment of this disclosure, a method for processing a substrate includes receiving the substrate on a substrate holder disposed in a processing chamber, the substrate including a layer to be processed and a patterned mask disposed over the layer to be processed. The method further includes flowing a processing gas into the processing chamber, and replacing a material of the patterned mask with a metal of the processing gas to form a metal patterned mask occupying a same location as the patterned mask. And the method further includes etching, using the metal patterned mask as an etch mask, the layer to be processed to form a patterned layer, the patterned layer including feature openings.

In accordance with another embodiment of this disclosure, a method for processing a substrate includes receiving the substrate on a substrate holder disposed in a processing chamber, the substrate including a dielectric layer and a patterned amorphous silicon (a-Si) layer disposed over the dielectric layer. The method further includes flowing a $WF_6$ gas into the processing chamber, and igniting the $WF_6$ gas into a plasma. The method further includes replacing silicon of the patterned a-Si layer with tungsten using the plasma to form a patterned tungsten layer in a same location as the patterned a-Si layer. And the method further includes etching, using the patterned tungsten layer as an etch mask, the dielectric layer to form channel holes.

And in accordance with yet another embodiment of this disclosure, a system for processing a substrate includes a substrate holder disposed in a processing chamber, a gas inlet path coupled to a gas shower head of the processing chamber, a radio-frequency (RF) power source electrically coupled to the substrate holder, and a controller electrically coupled to the gas inlet path, the RF power source, and a memory storing instructions to be executed in the controller. The instructions when executed cause the controller to receive the substrate on the substrate holder, the substrate including a dielectric layer and a patterned amorphous silicon (a-Si) layer disposed over the dielectric layer. The instructions when executed further cause the controller to flow a $WF_6$ gas through the gas shower head into the processing chamber, and ignite, using an RF power generated by the RF power source and applied to the substrate holder, the $WF_6$ gas into a plasma. The instructions when executed further cause the controller to replace silicon of the patterned a-Si layer with tungsten using the plasma to form a patterned tungsten layer in a same location as the patterned a-Si layer, and etch, using the patterned tungsten layer as an etch mask, the dielectric layer to form channel holes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
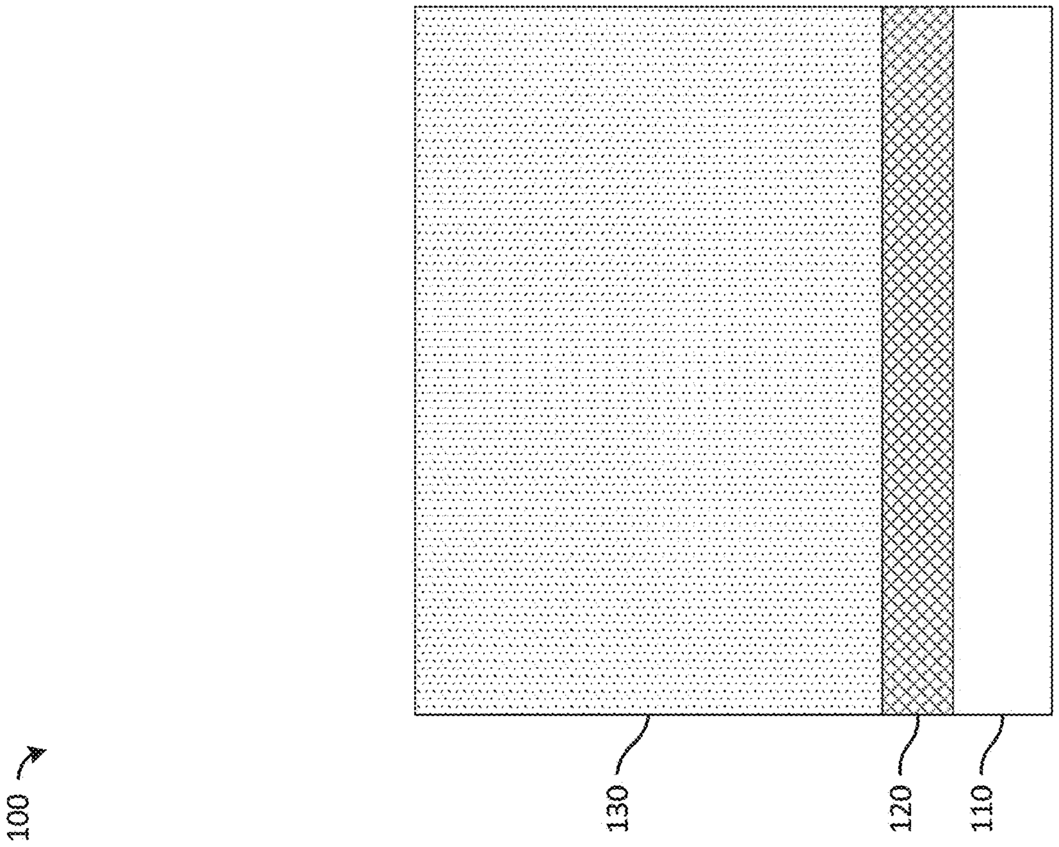
FIGS. 1A-1E are cross-sectional views of an electronic device throughout various steps of a processing method in accordance with an embodiment of this disclosure.

Semiconductor devices are commonly fabricated by creating patterns on silicon wafers or other substrates, and transferring those patterns to form various electrical components. Hard masks play a crucial role in patterning because they are used to define these regions with precision. They are resistant to etchants and other chemicals that remove unprotected areas of a substrate during patterning processes, making them invaluable for high-resolution definition.

Presently, hard masks are typically made of durable materials such as silicon nitride, silicon carbide, various metal nitrides, and other refractory compounds. These materials allow for them to withstand the harsh conditions present during etching or ion implantation. However, the process of modifying the properties of these hard masks presents a significant challenge. Conventional techniques may include dry etching or wet chemical processes, but these approaches often suffer from issues of non-uniformity, over-eroding, difficulty in controlling reaction endpoints, and damage to underlying layers.

Furthermore, traditional methods utilize tight process controls and multiple complex steps that increase processing time, complexity, and cost. As semiconductor devices become progressively smaller and more intricate, there is an ever-increasing demand for methods that can offer greater precision in the modification of hard masks. Specifically, controlled adjustments to the composition, thickness, and other properties of a hard mask at a microscopic level are desired to keep pace with the miniaturization of semiconductor device features.

Self-limited reactions have garnered interest as they naturally cease once the reactive species have been consumed or a passivating layer has been formed, providing an inherent endpoint to the reaction. Unfortunately, incorporating self-limiting reaction mechanisms into the modification of hard masks is challenging due to the difficult balance of reactive behavior with existing material properties.

The proposed methods and systems of this disclosure provide an improved technique for modifying hard masks by implementing a self-limiting replacement reaction. This approach enables precise control over the modification process, avoiding over-etching and enabling uniform alteration of the hard mask properties without compromising the integrity of the underlying layers. By overcoming limitations of conventional methods and introducing a novel approach that harnesses self-limiting behavior, this technology may improve the fidelity and efficiency of semiconductor patterning processes.

High aspect ratio contact (HARC) etch processes that use amorphous carbon layers (ACLs) and/or a-Si as the etch mask are not sufficiently selective, which is a limiting factor in conventional HARC etch processes. As an attempt to ameliorate the difficulty of poor selectivity from a-Si and ACL etch masks, methods have been proposed which use tungsten as the etch mask. Unfortunately, tungsten etch masks are difficult to pattern. And as a further difficulty, conventional methods form tungsten films with high stress. As a result, the high stresses increase the chance of wafer bow being out of spec.

This disclosure describes embodiment methods of processing a substrate by using a replacement reaction induced through the exposure of the substrate to a processing gas to replace a patterned mask with a new material to form a hard mask with a higher selectivity than the conventional a-Si or ACL masks. As a result, the processing method of this disclosure may prevent high stresses through tungsten mask deposition and lithography steps.

The processing method of this disclosure enables the direct replacement of a patterned mask with tungsten without requiring additional lithography, etching, or planarization steps. And by replacing the a-Si mask with tungsten through the replacement reaction, the new hard mask comprising tungsten is formed in place of the a-Si mask in the same location and comprising the same patterning, which avoids the difficulties which may arise through processes to pattern the tungsten hard mask. Rather, the replacement reaction forms the tungsten hard mask already patterned. And further, HARC etch processes may be enabled by using the tungsten hard mask through the implementation of the processing method of this disclosure while avoiding the difficulties described above when using conventional a-Si or ACL masks.

Figure 4:
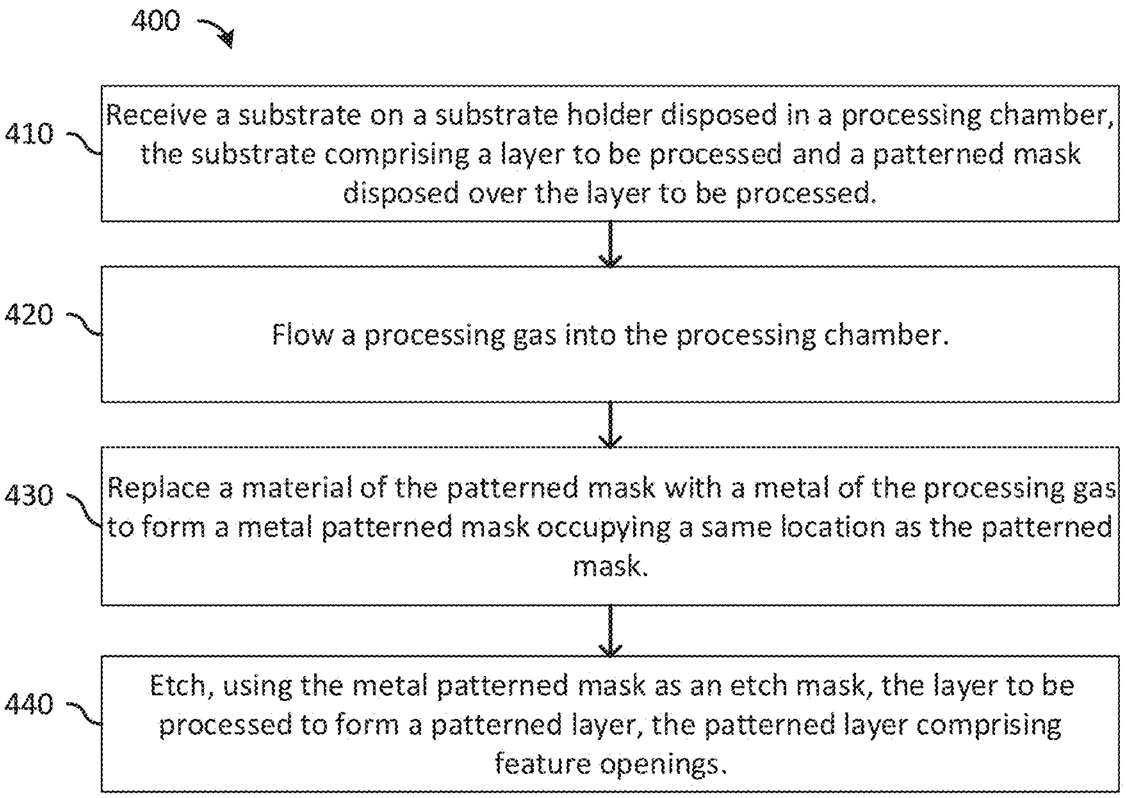
FIG. 4 is a flowchart of a processing method in accordance with an embodiment of this disclosure.
Figure 5:
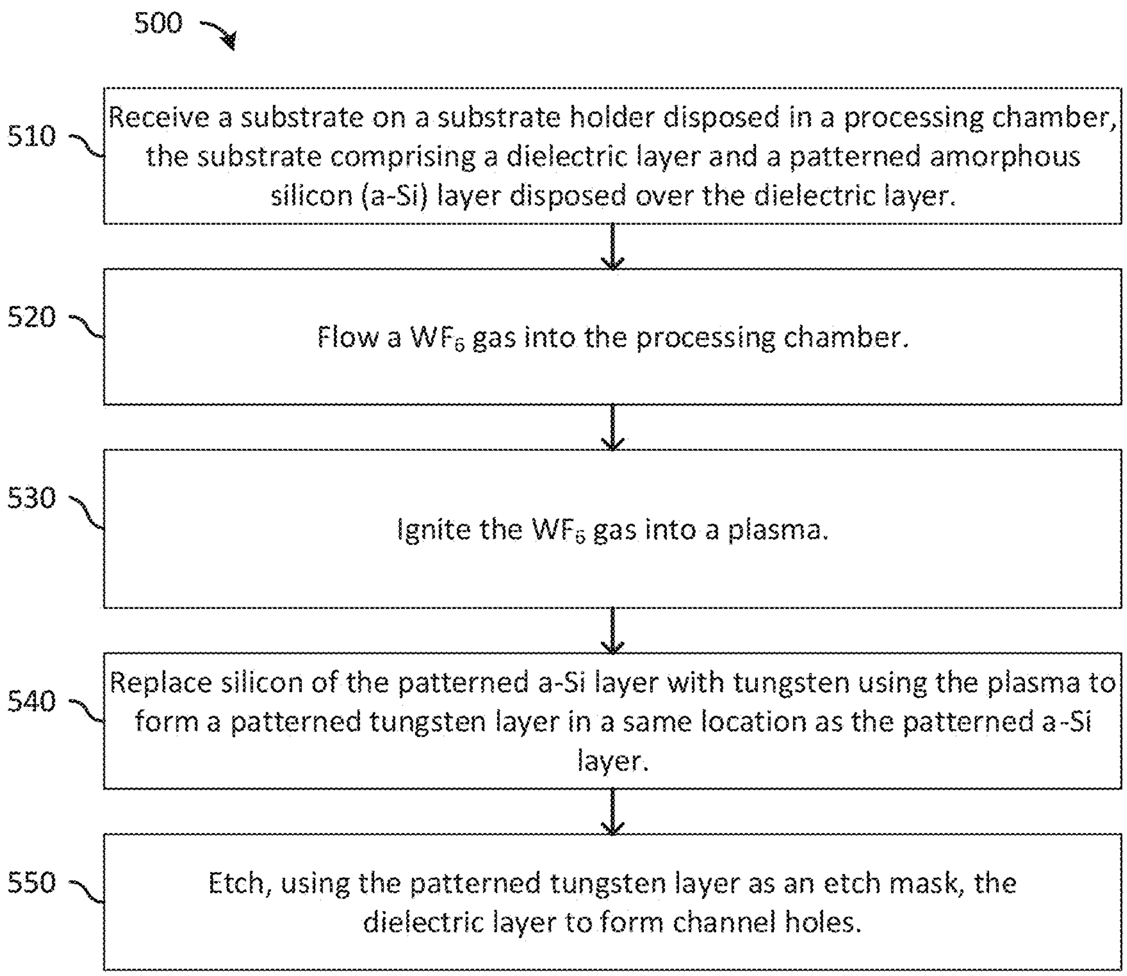
FIG. 5 is a flowchart of a processing method in accordance with an embodiment of this disclosure.

Embodiments provided below describe various methods, apparatuses and systems of processing a substrate, and in particular, to methods, apparatuses, and systems that use a replacement reaction to enable the modification of a patterned mask to form a modified patterned mask which may be used in further processing steps. The following description describes the embodiments. FIGS. 1A-1E are used to describe steps of the processing method of this disclosure in an embodiment that completely replaces the material of a patterned mask using a processing gas by illustrating the steps on an example substrate. FIG. 2 is used to describe another embodiment where material of the patterned mask of the substrate is partially replaced. An example processing system capable of implementing the processing method of this disclosure is described using FIG. 3. And FIGS. 4-5 are flowcharts used to illustrate two example processing methods which replace the material of the patterned mask with a different material by exposing the patterned mask to a processing gas in accordance with embodiments of this disclosure.

FIGS. 1A-1E illustrate cross-sectional views of an electronic device 100 throughout various steps of a processing method that replaces patterned mask material in accordance with an embodiment of this disclosure.

Figure 2:
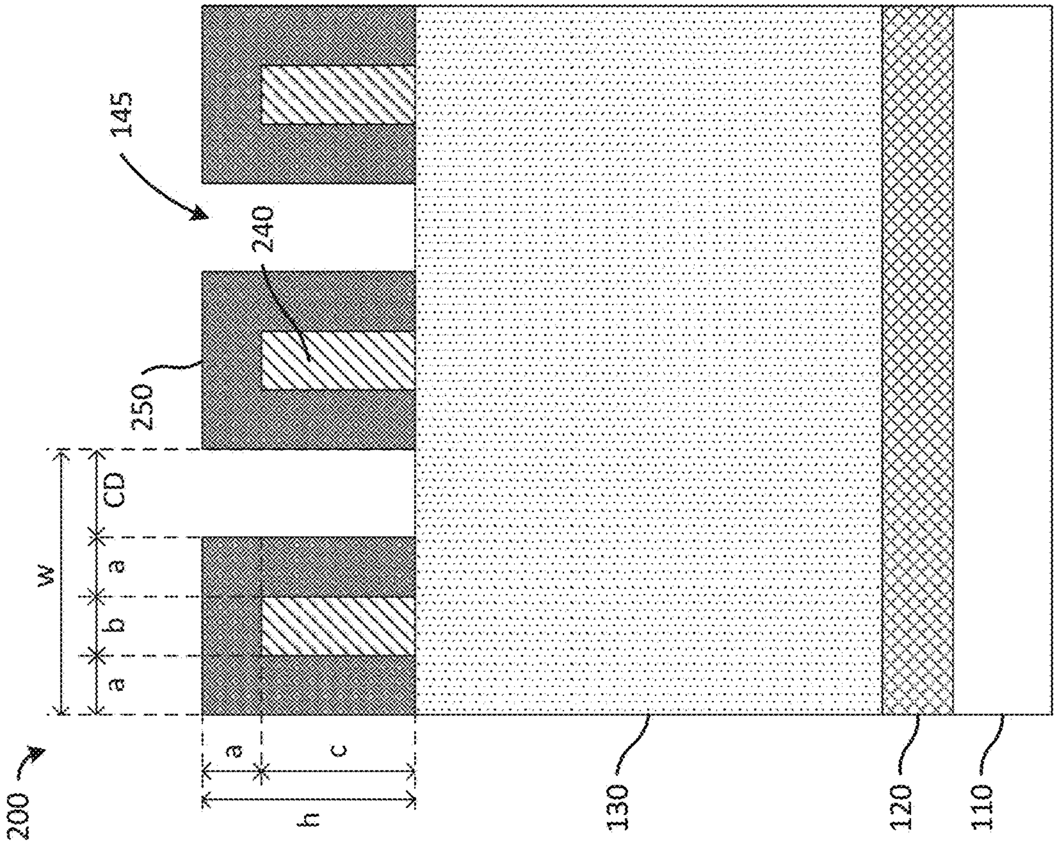
FIG. 2 is a cross-sectional view of an electronic device with a partial replacement of patterned mask material in accordance with an embodiment of this disclosure.

FIG. 1A illustrates a cross-sectional view of the electronic device 100 as received in a suitable substrate processing system to begin the processing method that replaces patterned mask material in accordance with an embodiment of this disclosure. The electronic device 100 comprises a substrate 110, an underlying layer 120 disposed over the substrate 110, and a dielectric layer 130 disposed over the underlying layer 120.

In various embodiments, the substrate 110 may be any substrate known in the art suitable for fabricating the electronic device 100. For example, the substrate 110 may be any suitable substrate for which processing using the processing method of this disclosure is desired. Specifically, the substrate 110 may be any suitable substrate which may have material of a mask replaced through exposure to a processing gas. In various embodiments, the substrate 110 is a wafer and is a silicon wafer in one embodiment. More possible substrates include flat panel displays, photolithography masks, and others. Although many substrates are circular, there is no requirement that the substrate 110 be circular or even substantially circular. For example, the substrate 110 may be circular, square, rectangular, or any other desired shape including irregular shapes.

The underlying layer 120 may be formed via suitable methods known in the art. In various embodiments, the underlying layer 120 may be a barrier layer to prevent diffusion of material. In other embodiments, the underlying layer 120 may comprise a variety of electrical components formed before depositing the dielectric layer 130 over the underlying layer 120. For example, the underlying layer 120 may be an underlying integrated circuit (IC) formed through conventional methods, and the processing method that replaces material of a mask layer through the use of a processing gas of this disclosure may be used to form channel holes through the dielectric layer 130 to the underlying ICs of the underlying layer 120.

The dielectric layer 130 may be formed via suitable methods known in the art. In various embodiments, the dielectric layer 130 may be a $SiO_2$ layer formed through conventional methods, such as through chemical vapor deposition (CVD), plasma enhanced CVD (PECVD), or etcetera. In other embodiments, the dielectric layer 130 may be any material suitable for forming the electronic device 100 such that materials of the processing gas used in the processing method of this disclosure do not react with the dielectric layer 130.

Figure 1B:
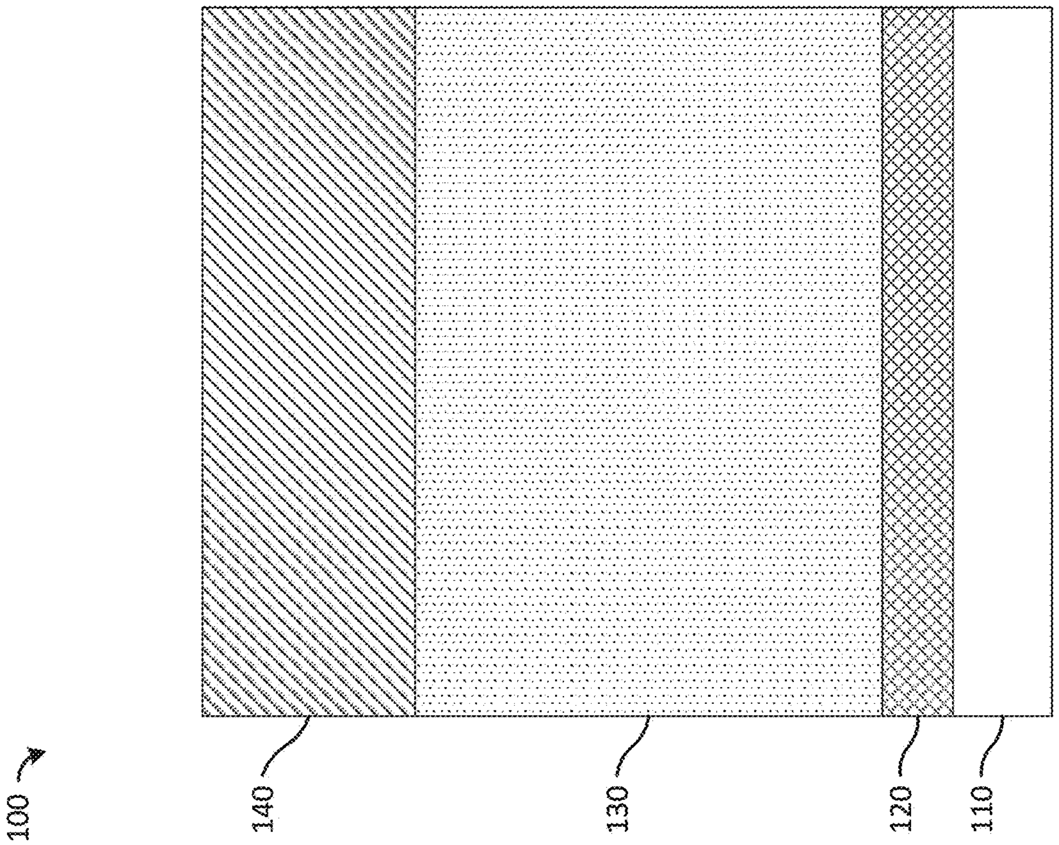

After receiving the electronic device 100 on a substrate holder of a processing system (such as processing system 30 described using FIG. 3), a mask material may be deposited over the dielectric layer 130, such as described using FIG. 1B.

FIG. 1B illustrates a cross-sectional view of the electronic device 100 after depositing a mask material over the dielectric layer 130 to form a mask 140. The mask 140 may be deposited through any suitable method known in the art, such as via PECVD. The mask 140 may be any material suitable for forming a patterned mask to be used in the fabrication of electronic devices. For example, in some embodiments, a chemical mechanical planarization process may be implemented after depositing the material of the mask 140 to form a smooth and flat surface over the dielectric layer 130.

In various embodiments, the mask 140 is amorphous silicon (a-Si). Further, the mask 140 may be any suitable material capable of reacting with a processing gas in a replacement reaction that replaces the material of the mask 140 with material from the processing gas in accordance with the processing method of this disclosure. After depositing the mask 140 over the dielectric layer 130, the mask 140 may be patterned with a feature pattern in accordance with a processing recipe to form the electronic device 100, such as described using FIG. 1C.

Figure 1D:
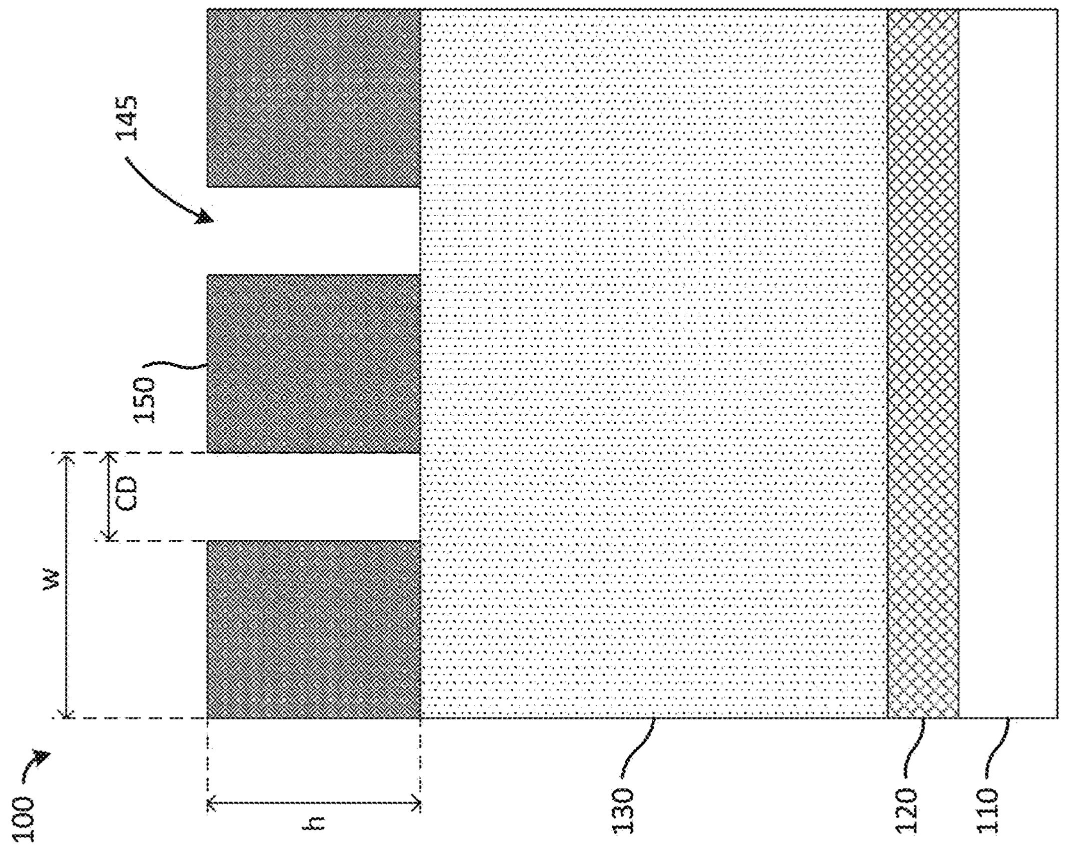
Figure 1C:
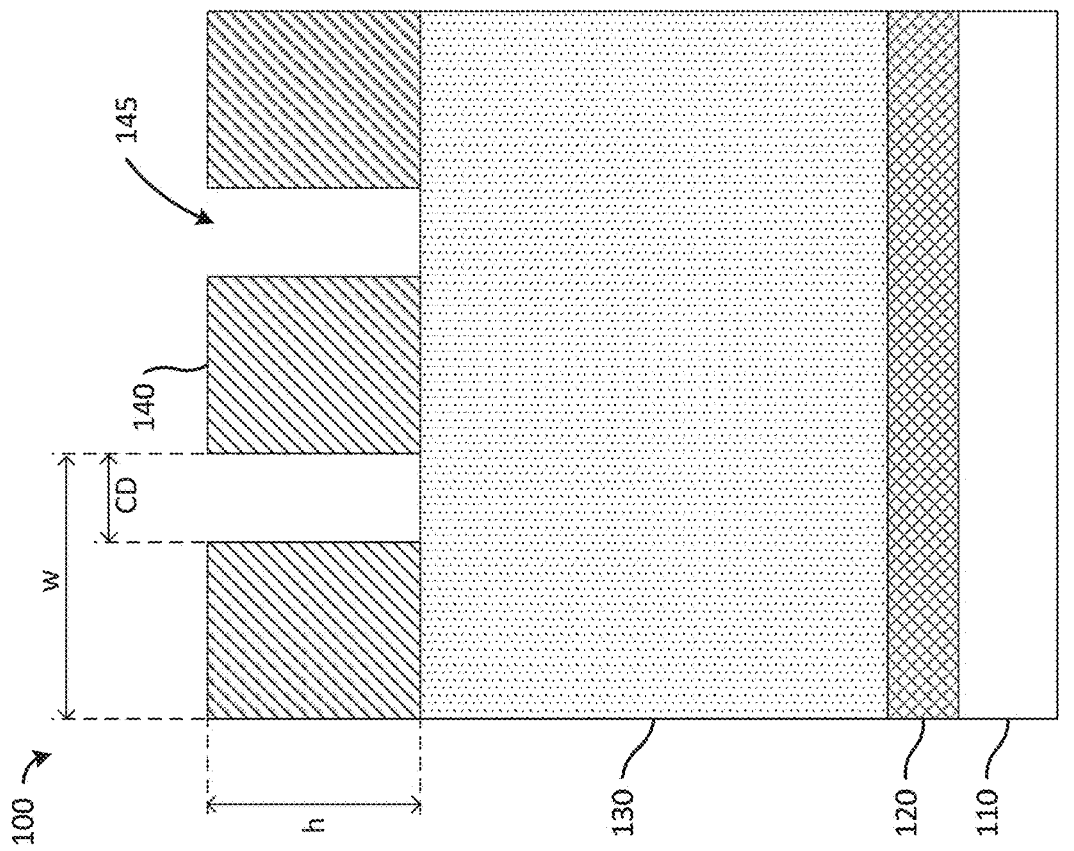

FIG. 1C illustrates a cross-sectional view of the electronic device 100 after patterning the mask 140 to form openings 145. The openings 145 may be formed according to a feature pattern and used to etch features in the dielectric layer 130. The mask 140 may be patterned through conventional methods for patterning a mask. For example, the mask 140 may be patterned through a typical photoresist deposition, exposure, and then etching process to transfer the feature pattern to the mask 140 and form openings 145.

In various embodiments, the openings 145 may be formed to be used to etch various different HARC features, such as pillars, channel holes, capacitor holes, and/or plugs. The mask 140 may be formed with a mask thickness (h), and the openings 145 may be formed in accordance with a processing recipe that specifies a feature pattern with a critical dimension (CD) and a pitch (w). The mask 140 illustrated in FIG. 1C may be referred to as a patterned mask, or a patterned a-Si layer in various embodiments.

After forming the openings 145, or in other words patterning the mask 140, the processing method may expose the mask 140 to a processing gas to cause replacement reactions between the material of the mask 140 and the processing gas. As a result, the patterned mask 140 is replaced to form a new hard mask comprising the same feature pattern (and openings 145) and comprising material that enables a higher selectivity than the mask 140, such as described using FIG. 1D.

FIG. 1D illustrates a cross-sectional view of the electronic device 100 after using a replacement reaction to completely replace the material of the mask 140 with a new material from a processing gas to form a hard mask 150 of the same dimensions. The processing gas used to implement the replacement reaction may be any suitable gas for replacing the material of the mask 140 with the new material of the processing gas without reacting with exposed regions of the dielectric layer 130 through the openings 145. Further, the replacement reaction may replace the material of the mask 140 with the new material and form the hard mask 150 comprising the same dimensions and occupying the same location as the mask 140.

In an embodiment where the processing gas is $WF_6$, the dielectric layer 130 is $SiO_2$, and the mask 140 is a-Si, the replacement reaction may replace silicon of the mask 140 with tungsten (W) from the processing gas according to the reaction equation: $2WF_6\,(g)+3Si\,(s)\rightarrow 2W\,(s)+3SiF_4\,(g)$. And thus, the hard mask 150 comprises tungsten. The hard mask 150 may be referred to as a patterned hard mask, or a metal patterned mask depending on the materials of the various embodiments.

The openings 145 in the hard mask 150 may remain the same dimensions and in the same location as they were in the mask 140. In other embodiments, the dimensions may vary after the replacement reaction. To prevent dimensional variation, processing methods may correspondingly pattern the openings 145 in the mask 140 in a manner such that after the replacement reaction, the openings 145 in the hard mask 150 are of the desired dimensions and location.

In various embodiments, the sizes of the dimensions of the openings 145 are such as desired for the features being formed in the electronic device 100. For example, the pitch (w) may be between about 10 nm and about 50 nm. Further, the CD may be between about 3 nm and about 25 nm. The mask thickness (h) may be any suitable thickness sufficient for etching the desired features in the dielectric layer 120 without penetrating through the hard mask 150 such as between about 100 nm and about 1000 nm. In various embodiments, the openings 145 may be capacitor holes used to form capacitors (the features). After forming the hard mask 150, the processing method uses the hard mask 150 as an etch mask to etch features according to the feature pattern (openings 145) into the dielectric layer 130, such as described using FIG. 1E.

Figure 1E:
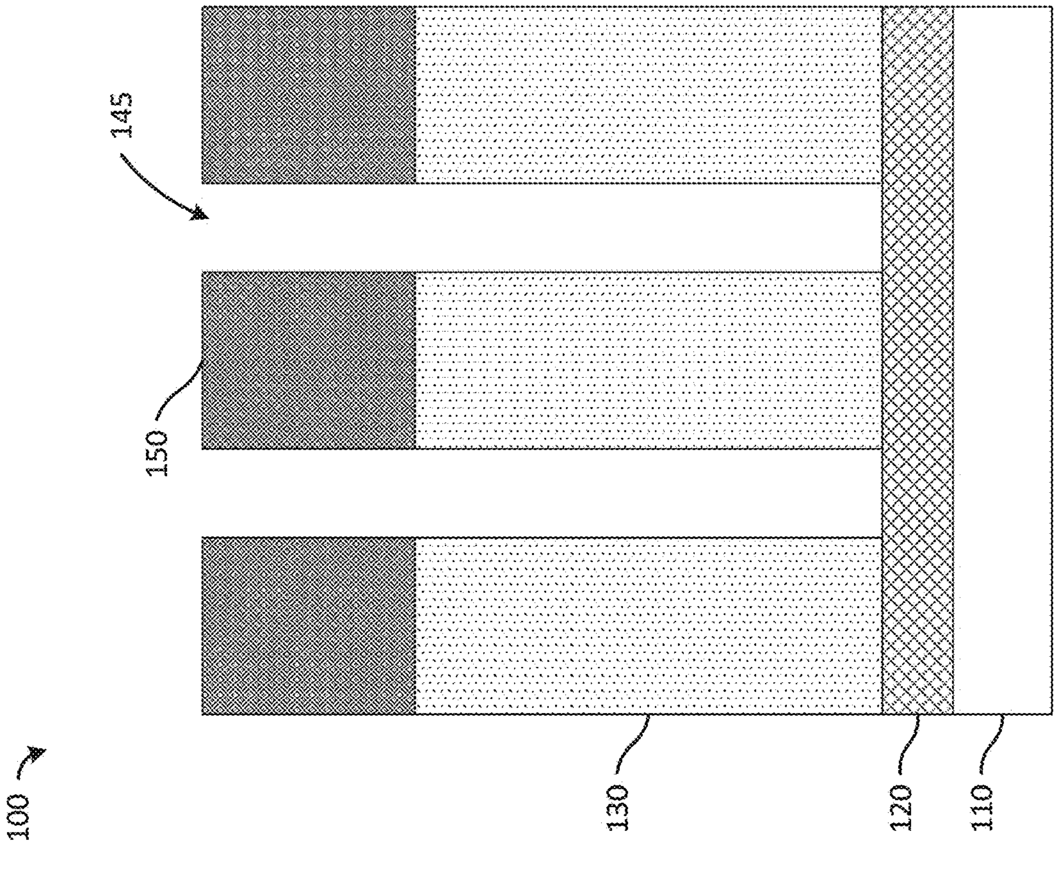

FIG. 1E illustrates a cross-sectional view of the electronic device 100 after using the hard mask 150 as an etch mask to etch features in the dielectric layer 130. Various conventional etch methods may be used to etch the features according to the feature pattern of the hard mask 150. For example, a dry-etching method or a wet-etching method may be used. Another benefit of the method of this disclosure results through the implementation of this method in a processing system that may perform the replacement of the mask 140 with material from the processing gas to form the hard mask 150 and that may subsequently etch to form the features according to the openings 145 in the hard mask 150 without transferring the substrate 110 to a different piece of equipment. Such an embodiment processing system is described using FIG. 3 below.

And the electronic device 100 may be any device whose fabrication techniques may benefit through the processing method of this disclosure. For example, the processing method of this disclosure may be implemented in the fabrication of dynamic random access memory (DRAM) devices, and the electronic device 100 may be a DRAM device.

In contrast to the embodiment illustrated in FIGS. 1A-1E, other embodiments may partially replace the material of the mask 140 with the new material from the processing gas, such as described using FIG. 2 below. Rather, the exposure of the mask 140 with the processing gas may cause the processing method to go from the step illustrated in FIG. 1C to FIG. 2.

FIG. 2 illustrates a cross-sectional view of an electronic device 200 after using a replacement reaction to partially replace the material of the mask 140 with a new material from a processing gas to form a hard mask 250 with a core 240 of the same material as the mask 140 that was not replaced in the replacement reaction. For example, the new material from the replacement reaction may only penetrate a penetration depth (a). As a result, the new material from the replacement reaction may only penetrate the penetration depth (a) from each exposed side of the mask 140. Further, because the new material only penetrates the penetration depth (a), the hard mask 250 may comprise the core 240 of the same material as the mask 140. Similarly labeled elements may be as previously described.

As illustrated in FIG. 2, the core 240 has a core height (c) equal to the mask thickness (h) minus the penetration depth (a), or (c=h−a). And because the replacement reaction enables the new material to penetrate from both sidewalls of the openings 145, the core 240 has a core CD (b) equal to the pitch (w) minus two of the penetration depths (a) and minus the openings 145 CD (CD), or (b=w−CD−2a). In various embodiments, the penetration depth (a) may be between about 1 nm and about 20 nm. The dimensions of the core CD (b) depends on the penetration depth (a), the openings 145 CD, and the pitch (w) and may vary based on those parameters. The dimensions of the core height (c) depends on the penetration depth (a), and the mask thickness (h) and may vary based on those parameters. The shapes and sizes of the openings 145 may be as desired according to a processing recipe to form features suitable for fabricating the electronic device 100.

In various embodiments, the penetration depth (a) may be varied/controlled through changes in processing parameters, such as temperature or exposure time. As a result, control of the penetration depth (a) may enable other selective deposition methods to form features confined within the hard mask 250, which may be subsequently removed through suitable methods and leave the core 240. Some embodiments may dynamically vary the processing parameters to control the penetration depth (a).

An embodiment processing system capable of implementing the embodiment processing methods described using FIGS. 1A-1E and FIG. 2 is described using FIG. 3 below.

Figure 3:
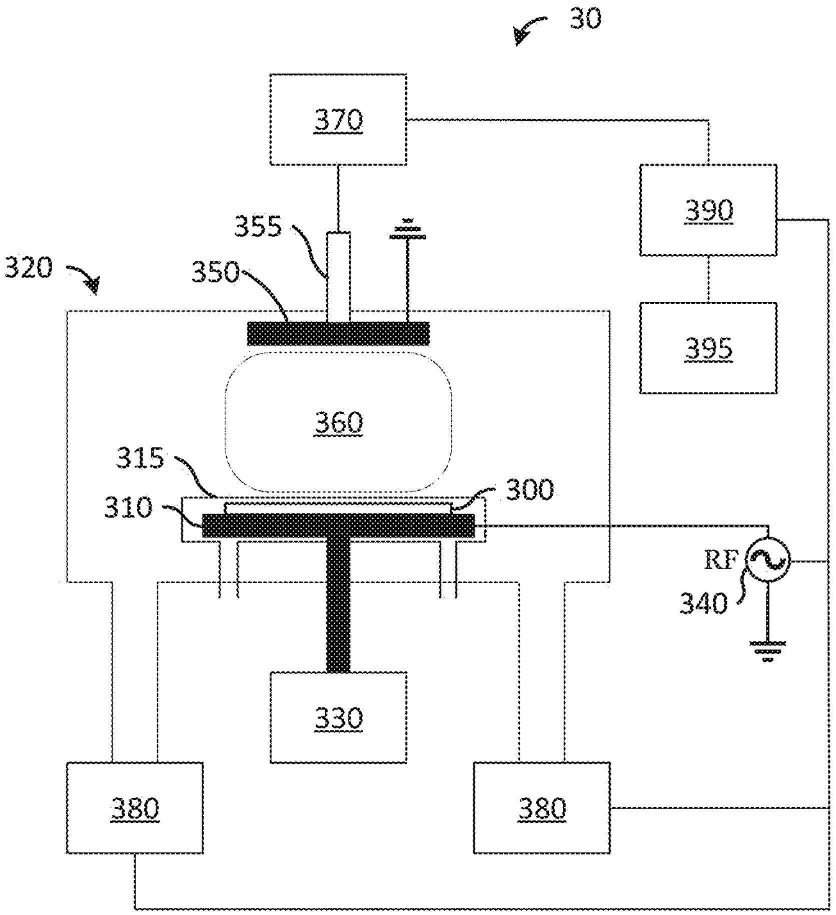
FIG. 3 is a schematic diagram of a processing system which may be used to replace patterned mask material in accordance with an embodiment of this disclosure.

FIG. 3 is a schematic diagram of a processing system 30 capable of implementing the processing method of this disclosure in accordance with an embodiment. The processing system 30 comprises a processing chamber 320, a gas delivery system 370, a controller 390, a memory 395, a radio-frequency (RF) power source 340, a temperature controller 330, and vacuum pumps 380.

For illustrative purposes, FIG. 3 illustrates a substrate 300 disposed on a substrate holder 310 (e.g., a circular electrostatic chuck (ESC)) inside the processing chamber 320 near the bottom. The substrate 300 may be optionally maintained at a desired temperature using a temperature adjuster 315 (e.g., a heater, or cooler, or heater/cooler combination) surrounding the substrate holder 310. In various embodiments, the temperature adjuster 315 may be disposed within the substrate holder 310 rather than surrounding. The temperature of the substrate 300 may be maintained by the temperature controller 330 connected to the substrate holder 310 and the temperature adjuster 315. In various embodiments, the temperature controller 330 may be electrically coupled with the controller 390.

In embodiments where the substrate holder 310 is an ESC, the ESC may be coated with a conductive material (e.g., a carbon-based or metal-nitride based coating) to enable the formation of electrical connections with the substrate holder 310. Further, the processing system 30 may be capable of implementing the processing method of this disclosure to process the substrate 300, which may be substrate 110 of FIGS. 1A-1E and FIG. 2 in various embodiments. The substrate 300 may be as previously described for the substrate 110 above.

Process gases may be introduced into the processing chamber 320 by a gas delivery system 370. The gas delivery system 370 comprises multiple gas flow controllers to control the flow of multiple gases into the chamber in various embodiments. Each of the gas flow controllers of the gas delivery system 370 may be assigned for each of fluorocarbons, noble gases, and/or balancing agents. In some embodiments, optional center/edge splitters may be used to independently adjust the gas flow rates at the center and edge of the substrate 300. The process gases or any exhaust gases or any gaseous byproducts from the replacement reaction (such as $SiF_4$) may be evacuated from the processing chamber 320 using the vacuum pumps 380. In other embodiments, a single processing gas may be introduced into the processing chamber 320, such as $WF_6$. And in those embodiments, the gas delivery system 370 comprises a single gas flow controller to control the flow of the lone processing gas used to implement the processing method of this disclosure.

As illustrated in FIG. 3, the substrate holder 310 may be a bottom electrode of the processing chamber 320. In the illustrative example in FIG. 3, the substrate holder 310 is connected to an RF power source 340. In some embodiments, a conductive circular plate inside the processing chamber 320 near the top is a top electrode 350. In FIG. 3, the top electrode 350 is electrically connected to a ground. In various embodiments, the top electrode 350 may be a gas shower head coupled to a gas inlet path 355, where the gas inlet path 355 enables the processing gas from the gas delivery system 370 to pass through the gas inlet path 355 and then through the top electrode 350 into the processing chamber 320 to be used in the replacement reaction of the processing method of this disclosure.

In various embodiments, the processing chamber 320 may be any suitable chamber for processing the substrate 300 using the processing method of this disclosure. For example, the processing chamber 320 may be an etch chamber configured to etch material from the substrate 300 (such as a reactive ion etch (RIE) chamber), or a deposition chamber configured to deposit material over the substrate 300 (such as a CVD or PECVD chamber). In embodiments where the processing chamber 320 is a PECVD chamber, the processing chamber 320 may be configured to ignite the processing gas into a plasma 360 by using the RF power source 340 to apply a signal to the substrate holder 310.

Still referring to FIG. 3, the substrate holder 310 may be any suitable device known in the art for holding a substrate during processing. In various embodiments, the substrate holder 310 is an electrostatic chuck that clamps the substrate 300 in place during processing using an electrostatic force. For example, in embodiments where the processing chamber 320 is a PECVD chamber configured for processing the substrate 300 with the plasma 360, electrostatic chucks may be used for the substrate holder 310. In other embodiments, the substrate holder 310 may be a vacuum chuck, a mechanical clamp, a magnetic chuck, or etcetera.

In various embodiments, the controller 390 is configured to enable control of the processing system 30, for example, by implementing the processing methods of this disclosure to use a processing gas to replace materials of a patterned mask with a new material to form a hard mask with high selectivity which enables HARC feature formation. The controller 390 may comprise a function generator including an appropriate digital and/or analog circuitry such as oscillators, pulse generators, modulators, combiners, and the like. The function generator is capable of generating one or more arbitrary waveforms that may be used for power modulation of the RF power source 340. In certain embodiments, some of the power modulation may be performed by the RF power source 340 itself instead of the function generator. In such cases, the function generator may generate a pulse train synchronized with the power modulation by the RF power source 340. In certain embodiments, although not illustrated, additional components (e.g., a broadband amplifier and a broadband impedance matching network) may be connected to the RF power source 340.

In certain embodiments, power sources may comprise a DC power source. The RF and/or DC power sources (e.g., the RF power source 340) may be configured to generate a continuous wave (CW) RF, pulsed RF, DC, pulsed DC, a high frequency rectangular (e.g., square wave) or triangular (e.g., sawtooth) pulse train, or a combination or superposition of more than one such waveform. In addition, power sources may be configured to generate a periodic function, for example, a sinusoid whose characteristics such as amplitude and frequency may be adjusted during the processing of the substrate 300. A typical frequency for the RF power source 340 can range from about 0.1 MHz to about 6 GHz. And a common frequency applied to the substrate holder 310 by the RF power source 340 to ignite the processing gas is 13.56 MHz.

Various configurations may be used for the processing system 30 that is configured to form a patterned hard mask by exposing a patterned mask (such as a-Si) to a processing gas (such as $WF_6$) to replace the material of the patterned mask with a new material of the processing gas through a replacement reaction. For example, the processing system 30 may be an RIE in the form of a capacitively coupled plasma (CCP) system, such as illustrated in FIG. 3 by the addition of another power source (not shown) electrically coupled to the top electrode 350, or an inductively coupled plasma (ICP) plasma system. In alternate embodiments, the processing system 30 may comprise a resonator such as a helical resonator. Further, microwave plasma (MW) or other suitable systems may also be used. In various embodiments, the RF power, chamber pressure, substrate temperature, gas flow rates and other plasma process parameters may be selected in accordance with the respective process recipe. In alternative embodiments, the processing system 30 may be a CVD system or a PECVD system which may deposit a film of material from the processing gas, which may diffuse, penetrate, and replace materials of the patterned mask of the substrate 300 to form a patterned hard mask according to an embodiment processing method of this disclosure. In various embodiments where the processing system 30 is a CVD system and during the deposition of the film of material from the processing gas, an adsorption step may be performed at a first temperature between about 0° C. and about 50° C. and an annealing step may be performed at a second temperature between about 300° C. and about 500° C. to implement the replacement reaction and form the patterned hard mask.

Still referring to FIG. 3, the memory 395 may be any suitable memory device for storing instructions for performing the processing method of this disclosure to be executed by the controller 390. For example, the memory 395 may be a solid state drive (SSD), a hard disk drive (HDD), or some form of volatile memory device such as dynamic random access memory (DRAM).

The controller 390 may be any suitable device capable of executing the processing method of this disclosure. The controller 390 may be coupled to the processing chamber 320, the vacuum pumps 380, the RF power source 340, the gas delivery system 370, the substrate holder 310, and the memory 395 storing instructions to be executed in the controller 390. By controlling the gas delivery system 370 to inject the processing gas into the processing chamber 320, and by controlling the processing chamber 320 and the substrate holder 310 to hold the substrate 300 and process the substrate 300 using the RF power source 340 to ignite the processing gas into the plasma 360 to replace the mask and form a patterned hard mask over a layer to be etched of the substrate 300, the controller 390 may implement the processing method of this disclosure. In various embodiments, the controller 390 may be an application specific integrated circuit (ASIC), a field programmable gate array (FPGA), a microcontroller (MCU), or some form of programmable logic circuit (PLC). The controller 390 is capable of implementing the embodiment processing methods of this disclosure, such as method 400 and method 500 described using the flowchart of FIG. 4 and FIG. 5 below.

FIGS. 4-5 illustrate example methods of processing a substrate in accordance with embodiments of the disclosure. The methods of FIGS. 4-5 may be combined with other methods and performed using the systems and apparatuses as described herein. For example, the methods of FIGS. 4-5 may be implemented in the processing system 30 of FIG. 3. Although shown in a logical order, the arrangement and numbering of the steps of FIGS. 4-5 are not intended to be limited.

FIG. 4 is a flowchart of a processing method that uses a replacement reaction to replace material of a patterned mask with material from a processing gas to form a hard mask in accordance with an embodiment of this disclosure. A method 400 of FIG. 4 may be combined with other methods and performed using the systems and apparatuses for processing a substrate as described herein, such as the processing system 30 of FIG. 3. Although shown in a logical order, the arrangement and numbering of the steps of FIG. 4 are not intended to be limited. The method steps of FIG. 4 may be performed in any suitable order.

Referring to FIG. 4, step 410 of a method 400 of processing a substrate using a replacement reaction to replace the material of a patterned mask with material from a processing gas to form a hard mask receives a substrate on a substrate holder disposed in a processing chamber. The substrate comprises a layer to be processed and a patterned mask disposed over the layer to be processed. The substrate, the substrate holder, and the processing chamber may be the substrate 300, the substrate holder 310, and the processing chamber 320 of the processing system 30 of FIG. 3 in an embodiment. In an embodiment where the substrate holder is an electrostatic chuck, the receiving of the substrate on the substrate holder may comprise using an electrostatic force of the electrostatic chuck to hold the substrate on the substrate holder during the method 400. The layer to be processed may be a dielectric layer, such as the dielectric layer 120 of FIGS. 1A-1E and FIG. 2. In some embodiments, the layer to be processed may be $SiO_2$. The patterned mask may be the mask 140 of FIG. 1C, and may be a-Si (or ACL in other embodiments).

Once the substrate is loaded on the substrate holder within the processing chamber, step 420 of the method 400 flows a processing gas into the processing chamber. For example, in an embodiment, the processing gas may comprise $WF_6$ and flow into the processing chamber using a gas delivery system, such as gas delivery system 370 of FIG. 3. The processing gas may be any gas suitable for replacing material of the patterned mask without interacting with exposed areas of the layer to be patterned. In various embodiments, the processing system may be a CVD, or a PECVD, or a RIE, and step 420 may further include igniting the processing gas into a plasma (such as for a PECVD or RIE). After injecting the processing gas into the processing chamber in step 420, the method 400 may proceed to step 430.

Still referring to FIG. 4, step 430 of the method 400 replaces a material of the patterned mask with a metal of the processing gas to form a metal patterned mask occupying a same location as the patterned mask. In various embodiments, the metal patterned mask occupies the same location as the patterned mask and comprises the same dimensions as the patterned mask. In other embodiments, the metal patterned mask may occupy the same location as the patterned mask, but shrink or expand in volume and, consequently, change dimensions of feature patterns in the metal patterned mask.

A change in volume of the metal patterned mask in comparison to the patterned mask it replaced may be prevented by accounting for dimension changes in the processing recipe and the original patterning of the patterned mask. For example, processing recipes that may result in the dimensions of the feature patterns changing through the replacement reaction may account for potential dimensional changes by specifying a different dimension for the feature pattern of the patterned mask. Consequently, the replacement reaction adjusts the dimensions and forms a metal patterned mask comprising feature patterns of desired dimensions.

In various embodiments, the patterned mask may be completely replaced through the replacement reaction to form the metal patterned mask, such as illustrated in FIG. 1E. In other embodiments, the patterned mask may only be partially replaced, where only the outer edges to some penetration depth into the patterned mask may be capable of reacting with the processing gas and being replaced with the metal to form the metal patterned mask. As a result, the metal patterned mask may comprise an inner core of the same material as the patterned mask. For example, the metal patterned mask may comprise tungsten with an a-Si core, such as illustrated in FIG. 2.

After forming the metal patterned mask in step 430, the method 400 has formed a metal patterned mask over the layer to be patterned, where the metal patterned mask comprises a feature pattern (openings) which may be used to form features in subsequent etch steps. Additionally, as a benefit of the method of this disclosure, the metal patterned mask has higher selectivity than the patterned mask and enables HARC etching. The method 400 may further perform etching steps (using the metal patterned mask as an etch mask) to form HARC features, and subsequent metal fills or other processing steps may be performed to finish fabricating an electronic device (such as a semiconductor device).

After forming the metal patterned mask in step 430, the method 400 may proceed to step 440. In step 440, the method 400 etches, using the metal patterned mask as an etch mask, the layer to be processed to form a patterned layer. The patterned layer comprises feature openings, which may be further processed to form channels, plugs, pillars, or other conventional feature known in the art with a high aspect ratio (HAR). In various embodiments, step 440 may be illustrated by the electronic device 100 of FIG. 1E.

As an additional example, another embodiment processing method which uses a processing gas to replace material of a patterned mask with a new material from the processing gas in a replacement reaction is described using the flowchart of FIG. 5 below.

FIG. 5 is a flowchart of a processing method that uses a replacement reaction to replace material of a patterned mask with material from a processing gas to form a hard mask in accordance with an embodiment of this disclosure. A method 500 of FIG. 5 may be combined with other methods and performed using the systems and apparatuses for processing a substrate as described herein, such as the processing system 30 of FIG. 3. Although shown in a logical order, the arrangement and numbering of the steps of FIG. 5 are not intended to be limited. The method steps of FIG. 5 may be performed in any suitable order.

Referring to FIG. 5, step 510 of the method 500 of processing a substrate receives the substrate on a substrate holder disposed in a processing chamber. The substrate comprises a dielectric layer and a patterned amorphous silicon (a-Si) layer disposed over the dielectric layer. The substrate, the substrate holder, and the processing chamber may be the substrate 300, the substrate holder 310, and the processing chamber 320 of the processing system 30 of FIG. 3 in an embodiment. In an embodiment where the substrate holder is an electrostatic chuck, the receiving of the substrate on the substrate holder may comprise using an electrostatic force of the electrostatic chuck to hold the substrate on the substrate holder during the method 500.

Once the substrate is loaded on the substrate holder within the processing chamber, step 520 of the method 500 flows a $WF_6$ gas into the processing chamber. In an embodiment, the flowing of the $WF_6$ gas may be performed by the gas delivery system 370 through the gas inlet path 355 of FIG. 3.

Still referring to FIG. 5, step 530 of the method 500 ignites the $WF_6$ gas into a plasma. The ignition of the $WF_6$ gas into a plasma may comprise biasing, using an RF power source, a substrate holder with an RF power, such as by using the RF power source 340 of the processing system 30 of FIG. 3. Further, the plasma may be the plasma 360 illustrated in FIG. 3. After forming the plasma in step 530, the method 500 proceeds to step 540.

Step 540 of the method 500 exposes the patterned a-Si layer to the plasma. By exposing the patterned a-Si layer to the plasma, the plasma reacts through a replacement reaction with silicon of the patterned a-Si layer. And as a result, the plasma replaces silicon of the patterned a-Si layer with tungsten from the $WF_6$ gas which was ignited into the plasma, and forms a patterned tungsten layer.

In various embodiments, the patterned tungsten layer completely replaces the patterned a-Si layer, and comprises the same dimensions and occupies the same location as the patterned a-Si layer. In other embodiments, the patterned tungsten layer partially replaces the patterned a-Si layer up to a penetration depth (hence self-limiting), and thus comprises a core of a-Si which was not replaced in the replacement reaction. In some embodiments, the patterned a-Si layer may be the mask 140 of FIG. 1C, the dielectric layer may be the dielectric layer 130 of FIGS. 1A-1E and FIG. 2, the patterned tungsten layer may be the hard mask 150 of FIGS. 1D-1E or the hard mask 250 with the core 240 in FIG. 2.

The method 500 may be implemented in a suitable processing system, such as a PECVD, or a RIE system. Again, the method 500 may perform additional processing steps after forming the patterned tungsten layer, such as by using the patterned tungsten layer as an etch mask in an etch process to form features according to the feature pattern of the patterned tungsten layer. Further, the tungsten enables high selectivity and thus HARC etch processes, which are benefits of the systems and methods of this disclosure.

After forming the patterned tungsten layer in step 540, the method 500 proceeds to step 550. In step 550, the method 500 etches, using the patterned tungsten layer as an etch mask, the dielectric layer to form channel holes. In various embodiments, step 550 may be illustrated by the electronic device 100 of FIG. 1E.

In other embodiments, different conventional feature openings may be formed through the etch process according to the processing recipe and feature pattern in the patterned tungsten layer. For example, plugs, pillars, or other suitable features comprising HAR may be etched due to the improved selectivity through the replacement of the patterned a-Si layer with the tungsten in accordance with the methods of this disclosure. Further processing steps may be performed to finish forming the channel holes, such as filling the channel holes with conductive material to form channels to an underlying integrated circuit in the substrate. Additionally, in various embodiments, the channel holes may be capacitor holes that are used to form capacitors in further processing steps.

Example embodiments of the invention are described below. Other embodiments can also be understood from the entirety of the specification as well as the claims filed herein.

Example 1. A method for processing a substrate includes receiving the substrate on a substrate holder disposed in a processing chamber, the substrate including a layer to be processed and a patterned mask disposed over the layer to be processed. The method further includes flowing a processing gas into the processing chamber, and replacing a material of the patterned mask with a metal of the processing gas to form a metal patterned mask occupying a same location as the patterned mask. And the method further includes etching, using the metal patterned mask as an etch mask, the layer to be processed to form a patterned layer, the patterned layer including feature openings.

Example 2. The method of example 1, where the processing gas is $WF_6$, the layer to be processed is $SiO_2$, the patterned mask is amorphous silicon (a-Si), the metal of the processing gas is tungsten, and the metal patterned mask is tungsten.

Example 3. The method of one of examples 1 or 2, where replacing the material of the patterned mask replaces the material of the patterned mask using a replacement reaction with the processing gas, the replacement reaction is $2WF_6(g)+3Si(s)\rightarrow 2W(s)+3SiF_4(g)$.

Example 4. The method of one of examples 1 to 3, where replacing the material of the patterned mask replaces an outer portion of the patterned mask to form the metal patterned mask with a core of the material of the patterned mask.

Example 5. The method of one of examples 1 to 4, where replacing the material of the patterned mask completely replaces the material of the patterned mask to form the metal patterned mask occupying the same location as the patterned mask.

Example 6. The method of one of examples 1 to 5, where the processing gas is ignited into a plasma to perform the replacing and the etching without modifying the plasma or the processing gas.

Example 7. The method of one of examples 1 to 6, further includes filling the feature openings with conductive material to form features.

Example 8. The method of one of examples 1 to 7, where the feature openings are capacitor holes, and the features are capacitors.

Example 9. The method of one of examples 1 to 8, where the feature openings are channel holes.

Example 10. A method for processing a substrate includes receiving the substrate on a substrate holder disposed in a processing chamber, the substrate including a dielectric layer and a patterned amorphous silicon (a-Si) layer disposed over the dielectric layer. The method further includes flowing a $WF_6$ gas into the processing chamber, and igniting the $WF_6$ gas into a plasma. The method further includes replacing silicon of the patterned a-Si layer with tungsten using the plasma to form a patterned tungsten layer in a same location as the patterned a-Si layer. And the method further includes etching, using the patterned tungsten layer as an etch mask, the dielectric layer to form channel holes.

Example 11. The method of example 10, further includes filling the channel holes with conductive material to form channels.

Example 12. The method of one of examples 10 or 11, where the dielectric layer is $SiO_2$.

Example 13. The method of one of examples 10 to 12, where replacing silicon of the patterned a-Si layer with tungsten using the plasma to form the patterned tungsten layer replaces an outer portion of the patterned a-Si layer to form the patterned tungsten layer with a core remaining from the a-Si layer.

Example 14. The method of one of examples 10 to 13, where replacing silicon of the patterned a-Si layer with tungsten using the plasma to form the patterned tungsten layer replaces all of the patterned a-Si layer to form the patterned tungsten layer of tungsten.

Example 15. A system for processing a substrate includes a substrate holder disposed in a processing chamber, a gas inlet path coupled to a gas shower head of the processing chamber, a radio-frequency (RF) power source electrically coupled to the substrate holder, and a controller electrically coupled to the gas inlet path, the RF power source, and a memory storing instructions to be executed in the controller. The instructions when executed cause the controller to receive the substrate on the substrate holder, the substrate including a dielectric layer and a patterned amorphous silicon (a-Si) layer disposed over the dielectric layer. The instructions when executed further cause the controller to flow a $WF_6$ gas through the gas shower head into the processing chamber, and ignite, using an RF power generated by the RF power source and applied to the substrate holder, the $WF_6$ gas into a plasma. The instructions when executed further cause the controller to replace silicon of the patterned a-Si layer with tungsten using the plasma to form a patterned tungsten layer in a same location as the patterned a-Si layer, and etch, using the patterned tungsten layer as an etch mask, the dielectric layer to form channel holes.

Example 16. The system of example 15, where the substrate holder is an electrostatic chuck (ESC), and the dielectric layer is $SiO_2$.

Example 17. The system of one of examples 15 or 16, where the processing chamber is a reactive ion etching (RIE) chamber.

Example 18. The system of one of examples 15 to 17, where the processing chamber is a chemical vapor deposition (CVD) chamber.

Example 19. The system of one of examples 15 to 18, where the processing chamber is a plasma enhanced chemical vapor deposition (PECVD) chamber.

Example 20. The system of one of examples 15 to 19, further includes vacuum pumps coupled to the processing chamber, the vacuum pumps configured to remove exhaust gases or gaseous byproducts from the processing chamber.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:

receiving the substrate on a substrate holder disposed in a processing chamber, the substrate comprising a layer to be processed and a patterned mask disposed over the layer to be processed;

flowing a processing gas into the processing chamber;

replacing a material of the patterned mask with a metal of the processing gas to form a metal patterned mask occupying a same location as the patterned mask; and etching, using the metal patterned mask as an etch mask, the layer to be processed to form a patterned layer, the patterned layer comprising feature openings.

2. The method of claim 1, wherein the processing gas is $WF_6$, the layer to be processed is $SiO_2$, the patterned mask is amorphous silicon (a-Si), the metal of the processing gas is tungsten, and the metal patterned mask is tungsten.

3. The method of claim 2, wherein replacing the material of the patterned mask replaces the material of the patterned mask using a replacement reaction with the processing gas, the replacement reaction is $2WF_6\,(g)+3Si\,(s)\rightarrow 2W\,(s)+3SiF_4\,(g)$.

4. The method of claim 1, wherein replacing the material of the patterned mask replaces an outer portion of the patterned mask to form the metal patterned mask with a core of the material of the patterned mask.

5. The method of claim 1, wherein replacing the material of the patterned mask completely replaces the material of the patterned mask to form the metal patterned mask occupying the same location as the patterned mask.

6. The method of claim 1, wherein the processing gas is ignited into a plasma to perform the replacing and the etching without modifying the plasma or the processing gas.

7. The method of claim 1, further comprising:

filling the feature openings with conductive material to form features.

8. The method of claim 7, wherein the feature openings are capacitor holes, and the features are capacitors.

9. The method of claim 7, wherein the feature openings are channel holes.

10. A method for processing a substrate, the method comprising:

receiving the substrate on a substrate holder disposed in a processing chamber, the substrate comprising a dielectric layer and a patterned amorphous silicon (a-Si) layer disposed over the dielectric layer;

flowing a $WF_6$ gas into the processing chamber;

igniting the $WF_6$ gas into a plasma;

replacing silicon of the patterned a-Si layer with tungsten using the plasma to form a patterned tungsten layer in a same location as the patterned a-Si layer; and etching, using the patterned tungsten layer as an etch mask, the dielectric layer to form channel holes.

11. The method of claim 10, further comprising:

filling the channel holes with conductive material to form channels.

12. The method of claim 10, wherein the dielectric layer is $SiO_2$.

13. The method of claim 10, wherein replacing silicon of the patterned a-Si layer with tungsten using the plasma to form the patterned tungsten layer replaces an outer portion of the patterned a-Si layer to form the patterned tungsten layer with a core remaining from the a-Si layer.

14. The method of claim 10, wherein replacing silicon of the patterned a-Si layer with tungsten using the plasma to form the patterned tungsten layer replaces all of the patterned a-Si layer to form the patterned tungsten layer of tungsten.

15. A method for processing a substrate, the method comprising:

receiving the substrate on a substrate holder disposed in a processing chamber, the substrate comprising a layer to be processed and a patterned mask disposed over the layer to be processed, the patterned mask comprising a first material and having a mask thickness;

flowing a processing gas comprising a metal into the processing chamber;

exposing the patterned mask to the processing gas to drive a replacement reaction, the replacement reaction forming a metal patterned mask comprising an outer portion of the metal surrounding a core of the first material by replacing the first material from exposed portions of the patterned mask with the metal of the processing gas to a penetration depth less than the mask thickness, the metal patterned mask occupying a same location as the patterned mask; and during the exposing, controlling a temperature of the processing gas and an exposure time of the processing gas to set the penetration depth.

16. The method of claim 15, wherein the penetration depth is between about 1 nm and about 20 nm.

17. The method of claim 15, wherein the first material comprises amorphous silicon (a-Si), the processing gas comprises $WF_6$, and the metal comprises tungsten.

18. The method of claim 15, further comprising etching, using the metal patterned mask as an etch mask, the layer to be processed to form a patterned layer comprising feature openings.

19. The method of claim 15, further comprising:

after forming the metal patterned mask, depositing material into openings of the metal patterned mask; and after depositing material into the openings, removing the outer portion of the metal to leave the core of the first material.

20. The method of claim 15, wherein controlling the temperature and the exposure time comprises dynamically varying the temperature and the exposure time during the replacement reaction to control the penetration depth.

* * * * *